United States Patent
Hong et al.

(10) Patent No.: US 7,746,117 B2
(45) Date of Patent: Jun. 29, 2010

(54) COMPLEMENTARY ENERGY PATH ADIABATIC LOGIC

(75) Inventors: Ci-Tong Hong, Xinzhuang (TW);
Cihun-Siyong Gong, Kaohsiung (TW);
Chun-Hsien Su, Kaohsiung (TW);
Muh-Tian Shiue, Hsin-chu (TW);
Kai-Wen Yao, Hengchun Township, Pingtung County (TW)

(73) Assignee: Chang Gung University, Tao-Yuan (TW)

( * ) Notice: Subject to any disclaimer, the term of this patent is extended or adjusted under 35 U.S.C. 154(b) by 0 days.

(21) Appl. No.: 12/236,571

(22) Filed: Sep. 24, 2008

(65) Prior Publication Data

US 2010/0073029 A1    Mar. 25, 2010

(51) Int. Cl.
*H03K 19/096* (2006.01)
(52) U.S. Cl. .............................. 326/98; 326/93; 326/96
(58) Field of Classification Search ................... 326/34, 326/93–98, 21
See application file for complete search history.

(56) References Cited

U.S. PATENT DOCUMENTS

| | | | | | |
|---|---|---|---|---|---|
| 5,473,269 | A | * | 12/1995 | Dickinson | 326/93 |
| 5,506,519 | A | * | 4/1996 | Avery et al. | 326/95 |
| 5,602,497 | A | * | 2/1997 | Thomas | 326/93 |
| 5,701,093 | A | * | 12/1997 | Suzuki | 326/98 |

OTHER PUBLICATIONS

Ye at al, QSERL:Quasi-static Energy Recovery Logic, Feb. 2001, IEEE Journal of Solid-State Circuits, vol. 36, No. 2, pp. 239-248.*

* cited by examiner

*Primary Examiner*—Vibol Tan
*Assistant Examiner*—Crystal L Hammond

(57) ABSTRACT

A complementary energy path adiabatic logic (CEPAL) includes an evaluation network and a power clock network. The evaluation network is a logic circuit composed of P-type MOS transistors and N-type MOS transistors. The power clock network includes a P-type and N-type MOS transistors and additional P-type and N-type MOS transistors, with each of the transistors involved in the power clock network acting as an active diode.

8 Claims, 9 Drawing Sheets

COMPLEMENTARY ENERGY PATH ADIABATIC LOGIC

BACKGROUND OF THE INVENTION

1. Field of Invention

The present invention relates to a logic circuit and, particularly, to a complementary energy path adiabatic logic (CEPAL) capable of improving reliability and energy efficiency and increasing the throughput thereof.

2. Description of Related Art

The conventional reversible adiabatic logic has a control signal feedback from the next stage thereof. Thus, design cost for large systems using such logic is expensive. Although an irreversible adiabatic logic has the advantage of not needing use of the next-stage control signal in implementation, almost all such circuits have the characteristics of dynamic circuit and the problem of relatively higher switch activities, which are related to a ratioed logic. In addition, most of the irreversible adiabatic logic circuits have the requirements of multi-phase and multi-clock, making use not favorable to circuit designers in terms of design complexity and required area for realization. In response to that, a quasi-static energy recovery logic (QSERL) circuit has been suggested to overcome the shortcomings of the irreversible logic circuit above mentioned. The conventional QSERL circuit mainly comprises an evaluation network and a power clock network. The power clock network comprises a diode-connected P-type metal-oxide-semiconductor (MOS) transistor, a diode-connected N-type MOS transistor and two power clocks (or two diodes and two power clocks). The evaluation network is a logic circuit combined with P and N-type MOS transistors. In operation, the evaluation network follows the two inputted power clocks to perform evaluation and operation jobs.

As shown in FIG. 7, the power clock network has MOS transistors QP1, QN1, QP2 and QN2, and four inverting circuits work with the power clock network to jointly realize a QSERL inverter chain with the MOS transistors QPl, QN1, QP2 and QN2. The inverter chain is formed by four cascaded stages of inverters. In the inverter chain, the first, second, third and four-stage inverters are composed of MOS transistors MP5 and MN5, MP6 and MN6, MP7 and MN7, and MP8 and MN8, respectively. This QSERL has simple and static logic-like characteristics, lending itself to have considerably reduced design complexity and switch activity. The design with the complementary power clocks has higher energy efficiency as compared with the prior art having more clocking phases. However, such QSERL has to alternatively maintain a "hold" phase, causing the output to be floated in operation and, thus, has the reliability issue regarding the operational correctness to be considered. Although this problem can be overcome by introducing an additional feedback keeper controlled by additional clocking signals into each of the QSERLs, energy efficiency is correspondingly reduced. Furthermore, the required implementation area and overhead for the additional keepers and the control signals may considerably limit the QSERL's applications. As may be seen from above, the conventional adiabatic logic still has problems to be solved and, thus, has to be improved.

SUMMARY OF THE INVENTION

It is an object of the present invention to provide a complementary energy path adiabatic logic (CEPAL) not only having the advantages of the QSERL but also almost eliminating the need of maintaining a "hold" phase under the same operation conditions, thereby capable of improving reliability and increasing throughput thereof.

It is another object of the present invention to provide a complementary energy path adiabatic logic avoiding both the ratioed logic and relatively higher switch activities of the prior art.

It is yet another object of the present invention to provide a complementary energy path adiabatic logic capable of considerably reducing complexity and required area in implementation and eliminating the reliability concern caused by the floated output.

DETAILED DESCRIPTION OF THE INVENTION

Figure 1:
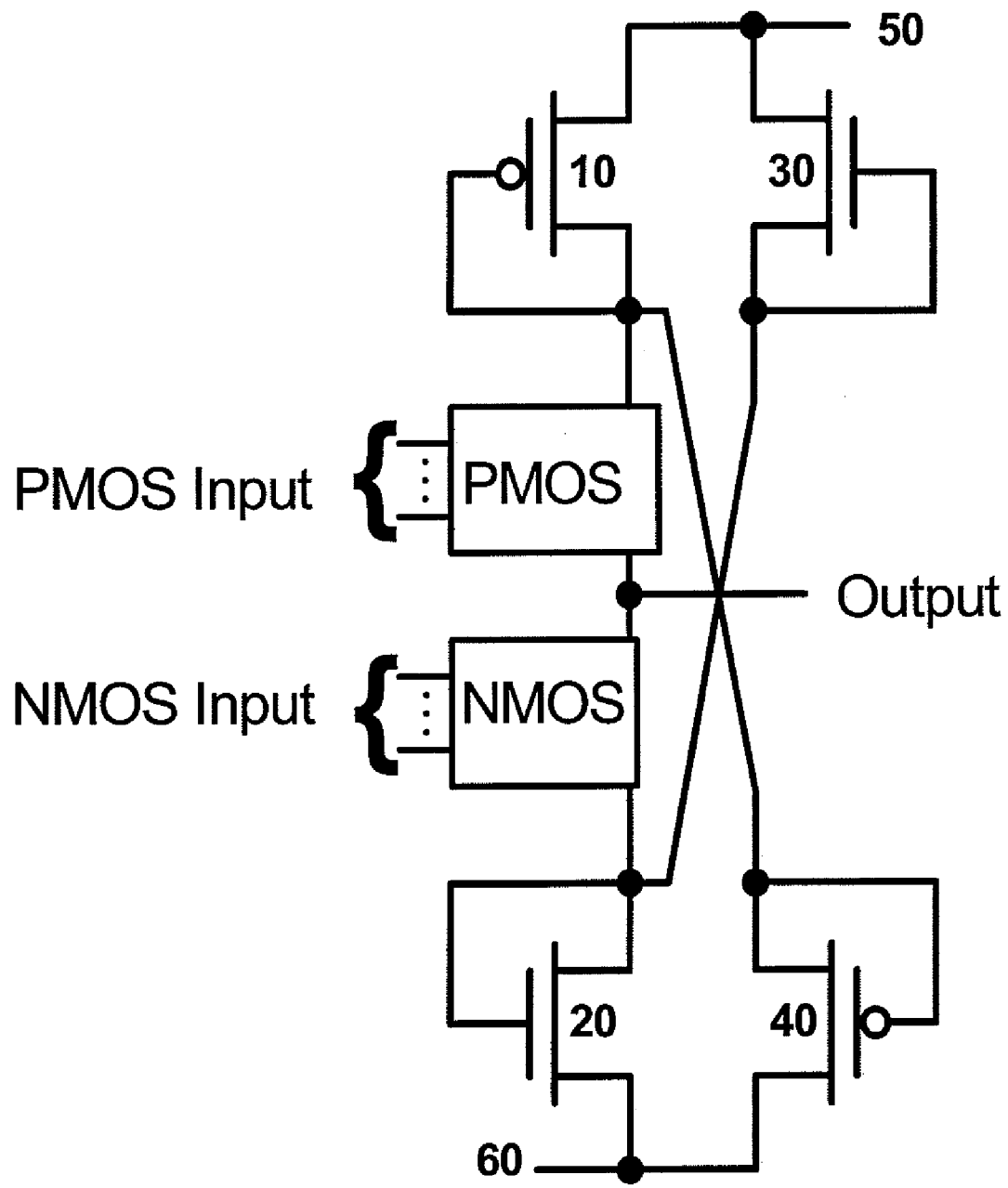
FIG. 1 is a schematic diagram of an embodiment of the present invention.
Figure 2:
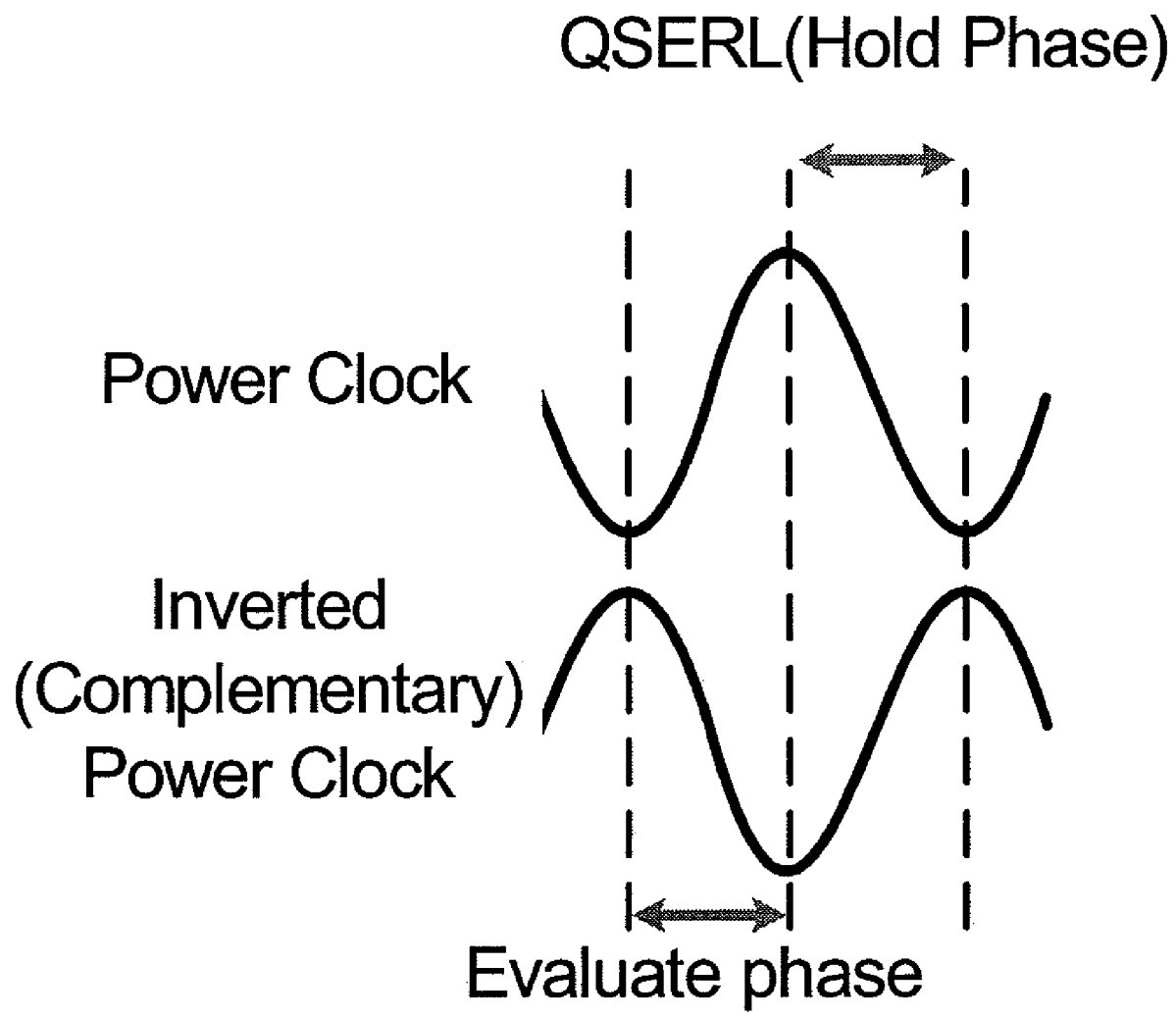
FIG. 2 is a schematic diagram exemplifying the power clocks of the CEPAL and QSERL circuits. The corresponding operational phases for the QSERL circuit are marked.

Referring to FIG. 1 to FIG. 6, a novel complementary energy path adiabatic logic (CEPAL) is described in the present invention. The complementary energy path adiabatic logic comprises an evaluation network and a power clock network. The power clock comprising a first P-type MOS transistor 10 and a second P-type MOS transistor 40, as well as a first N-type MOS transistor 20 and a second N-type MOS transistor 30. The evaluation network is a logic circuit composed of P- and N-type MOS transistors. The evaluation network, designed in accordance with the principle of a static complement metal-oxide-semiconductor (CMOS) circuit, is used to perform evaluations based on the input signals and power clocks. The following will be dedicated to particular features of the complementary energy path adiabatic logic in detail.

Each of the transistors involved in the power clock network acts as an active diode. The power clock input 50 has its phase opposite to that of the complementary power clock input 60. These MOS transistors 10, 30 and 20, 40 receive a power clock and an inverted complementary power clock, respectively. The complementary energy path adiabatic logic can achieve the evaluation purpose in accordance with the power clock, the complementary power clock, and the inputs of the evaluation network. In comparison with the QSERL counterpart, the CEPAL presented in this invention can lead to relatively lower energy dissipation.

The evaluation network of the complementary energy path adiabatic logic may be any of the logic circuits performing predefined functions.

In an embodiment, the logic circuit may be an inverter logic circuit.

In an embodiment, the logic circuit may be a four-stage inverter logic circuit.

In an embodiment, the logic circuit may be an NOR logic circuit.

In an embodiment, the logic circuit may be an NAND logic circuit.

In an embodiment, the logic circuit may be a flip-flop logic circuit.

In an embodiment, the logic circuit may be a D-type flip-flop circuit.

The logic circuit may otherwise be an adder logic circuit.

The complementary energy path adiabatic logic may also be a circuit that is cascaded with any of the logic circuits mentioned above and with a power clock network in common.

The complementary energy path adiabatic logic of the present invention is designed to satisfy the requirements of low power dissipation possessed in the prior art, high practicability, low design cost, and good reliability. The principle and efficacy of the present invention are described as follows.

First of all, the circuit operation of the present invention is discussed. Referring to FIG. 1, a circuit of a single-stage complementary energy path adiabatic logic circuit is shown. Although similar to the prior QSERL circuit and with complementary power clocks used therein, in structure, the circuit of the complementary energy path adiabatic logic of the present invention utilizes two sets of P and N- type transistors to lessen the operation limitations resulting from the circuit itself and complementary power clocks as compared with the QSERL counterpart. The lessening of the operating limitations is exemplified with the complementary power clocks shown in FIG. 2. In the complementary energy path adiabatic logic of the present invention and since the circuit structure has been changed, a new "evaluate phase" can be used in replacement of the "hold phase" of the QSERL with the same number of power clocks inputted. The operation based on such complementary power clocks is generally called "true single-phase clocking" and lends the complementary energy path adiabatic logic of the present invention twice the evaluation interval as compared with the QSERL circuit. Assuming that 1) Vtn and |Vtp| are, respectively, the threshold voltage and absolute value of the threshold voltage of the N-type MOS transistor and P-type MOS transistor, and 2) Output shown in FIG. 1 is an effective logic LOW initially, the operation of the complementary energy path adiabatic logic of the present invention will be the way described below.

When the complementary energy path adiabatic logic of the present invention operates in the evaluate phase, the power clock 50 rises from zero (the lowest voltage), while the complementary power clock 60 descends from the highest voltage. Assuming that PMOS Input turns on the "set of P-type MOS transistors", it conducts an adiabatic charging operation through the first P-type MOS transistor 10 until the Output has a voltage reaching the maximum voltage of the power clock 50 minus an absolute value of the threshold voltage of the P-type transistor |Vtp|. Otherwise, when NMOS Input turns on the "set of N-type MOS transistors", the complementary (anti-phase) power clock 60 conducts a adiabatic discharging process through the first N-type MOS transistor 20 until the Output has a voltage reaching the threshold voltage of the N-type transistor Vtn.

Figure 5A:
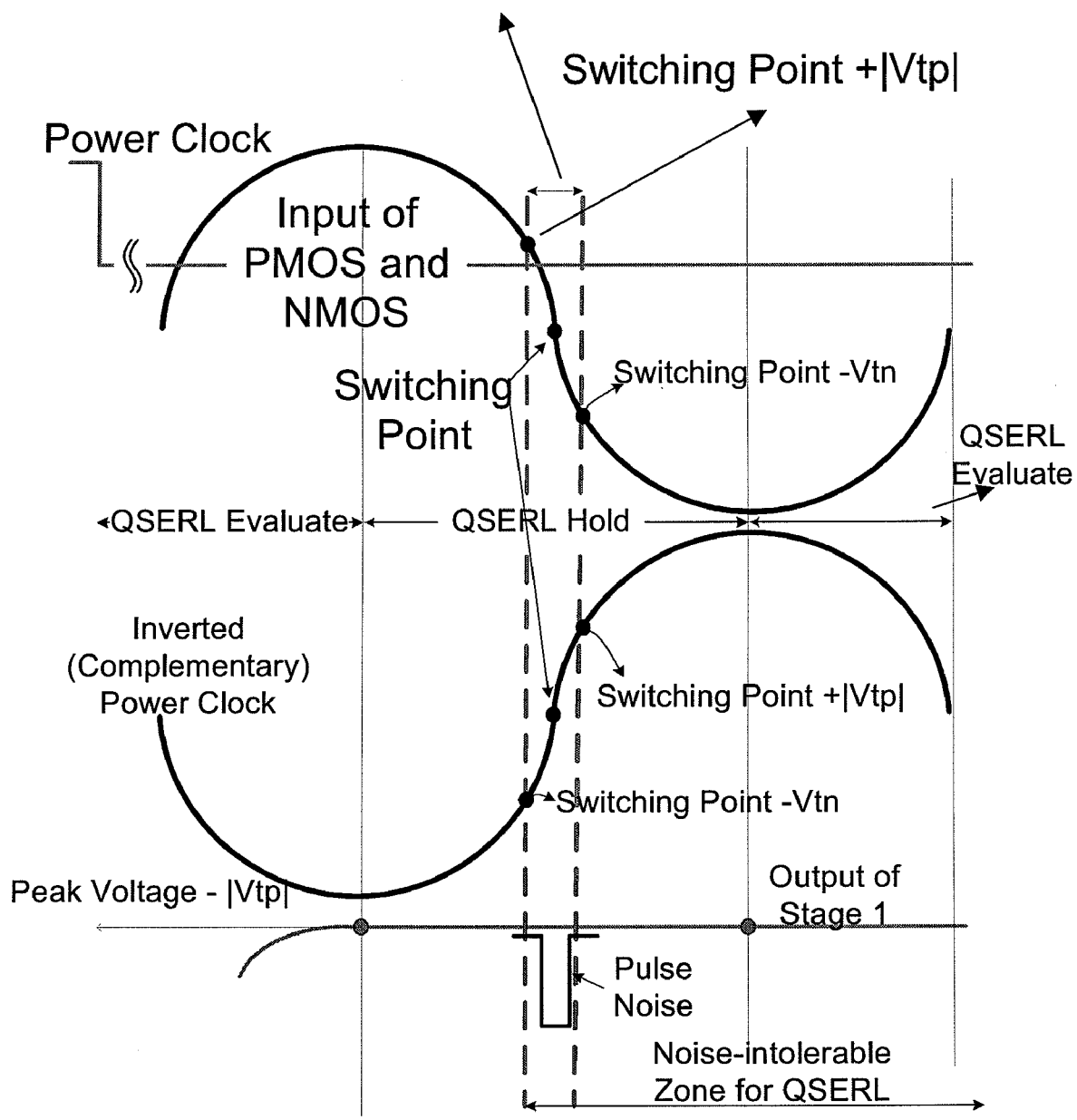
FIG. 5($a$) and ($b$) are, respectively, a sketch and waveforms showing a noise tolerance analysis in the four-stage inverter chains of QSERL and CEPAL, according to the present invention.

According to the above description, the adiabatic logic of the present invention is totally identical to the prior QSERL in operation. Herein, the power clock network of the QSERL is the first P-type MOS transistor 10 and the first N-type MOS transistor 20 shown in FIG. 1. That is, the adiabatic logic of the present invention is different from the QSERL counterpart as it requires two more MOS transistors, as can be seen from FIG. 1. In the evaluation network, the combination of the MOS transistors depends upon the purposes of the desired evaluation operation. On the other hand, when the power clock 50 begins to fall and the complementary power clock 60 begins to rise, the QSERL enters the hold phase shown in FIG. 2, leading to the output becoming floating. Correspondingly, the output has a considerably reduced noise immunity, and, thus, the possibility of erroneous operation of the circuit of the QSERL circuit greatly increases. Furthermore, when PMOS Input and NMOS Input of the QSERL circuit keep constant during the next cycle of the power clocks (as shown in FIG. 5(a)), the floating state of the output of QSERL becomes longer. By contrast, when the adiabatic logic of the present invention enters the hold phase of QSERL shown in FIG. 2, the second P-type MOS transistor 40 and the second N-type MOS transistor 30 form in time a set of conductive paths, although the first P-type MOS transistor 10 and the first N-type MOS transistor 20 are also turned off. In the hold phase of the QSERL circuit, even the input signals of the evaluation network changes, and the adiabatic logic of the present invention can still finish the evaluation task through the second P-type MOS transistor 40 and the second N-type MOS transistor 30 and generate a correct output. By contrast, the QSERL circuit has an erroneous output due to the lack of the second P-type MOS transistor 40 and the second N-type MOS transistor 30.

In this regard, the adiabatic logic of the present invention almost eliminates the adverse effect brought from the "hold phase" produced by the QSERL circuit. More importantly, the adiabatic logic of the present invention still has the ability of evaluation in response to the input signals, even though it operates in the "hold phase" of QSERL. Consequently, the adiabatic logic of the present invention can handle up to twice the throughput of the QSERL circuit.

Figure 3:
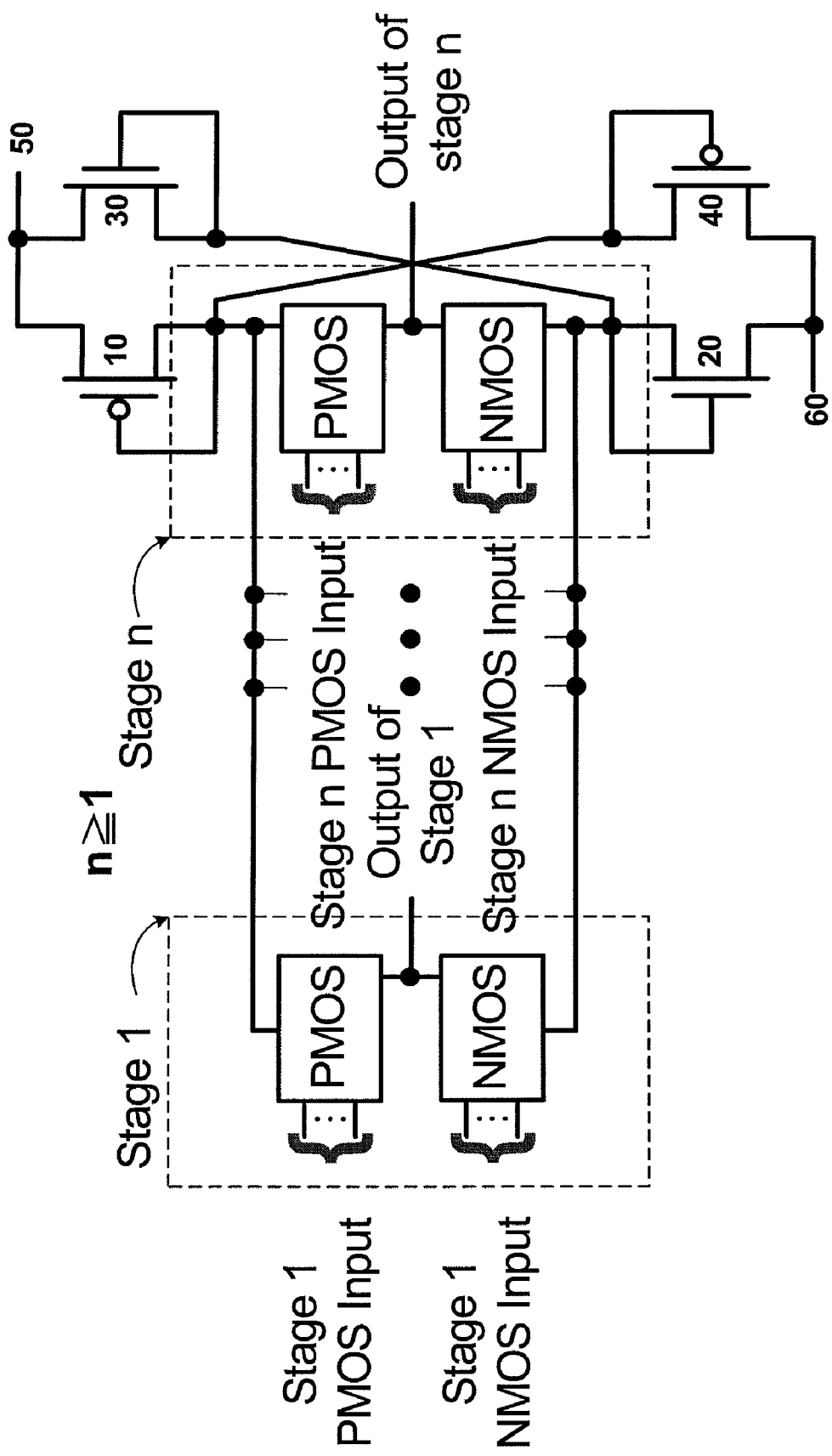
FIG. 3 is a schematic diagram of a CEPAL-based multiple cascaded logic circuits in which a common power clock is used, according to the present invention.

Almost all available adiabatic logic require multiple power locks and phases when the multi-stages are used therein, and, thus, a complicated timing control is needed in operation. In addition, some of the currently available adiabatic logic requires two complementary circuits to be coupled as some particular forms such as N-P domino form for multi-stage configuration, so as to operate normally. This results in a relatively more complicated system design and higher realization cost. This is quite different from the case in the adiabatic logic of the present invention shown in FIG. 3. As shown in FIG. 3, the multi-stage configuration for the adiabatic logic of the present invention can be almost totally identical to the traditional CMOS circuit, that is, with only one set of power clocks in common as compared with the prior art where multiple power clocks are required and their multiple-stage configurations are even more complicated. As a result, the adiabatic logic of the present invention has been of significant improvement in all of the aspects, as compared with the prior art. In fact, the adiabatic logic of the present invention effectively reduces the complexity and cost of the circuit design and considerably enhances practicability and application. Although the power clock network requires additional P and N-type MOS transistors for a single-stage circuit of the adiabatic logic of the present invention as compared to the QSERL, the adiabatic logic of the present invention and QSERL have the same number of P and N-transistors when they are in the multi-stage configurations in their evaluation networks, and each of them is with a set of power clock network with four transistors in common, as can be seen from the examples shown in FIG. 4 and FIG. 7.

Figure 4:
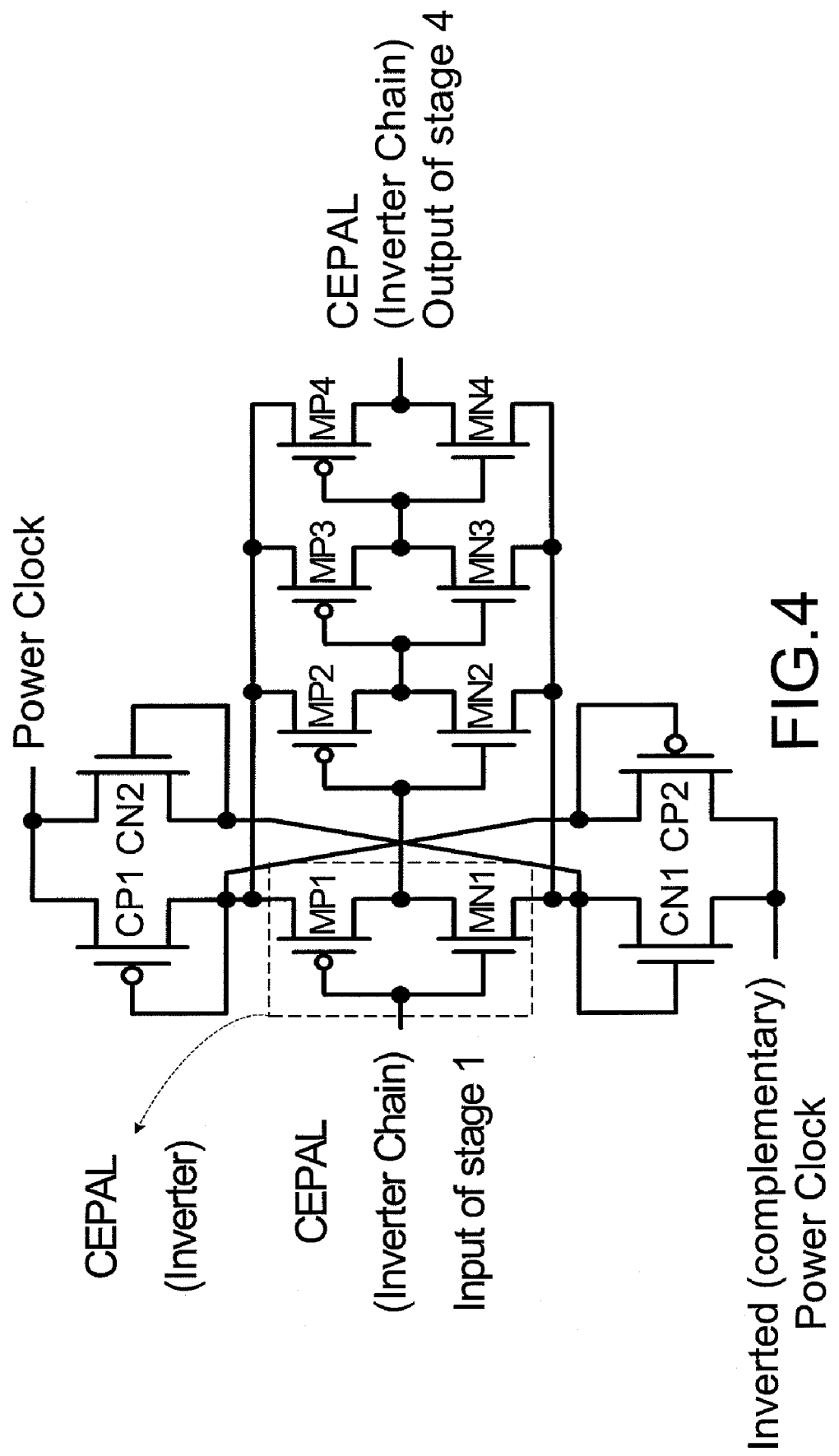
FIG. 4 is a schematic diagram of a CEPAL-based four-stage inverter chain in which a common power clock is used, according to the present invention.

As shown in FIG. 4, the adiabatic logic of the present invention uses MOS transistors CP1, CN1, CP2 and CN2 of a set of power clock network to realize an invert chain formed with cascaded four-stage inverters. In the inverter chain, the first inverter is composed of the MOS transistors MP1 and MN1, and the other inverters are also similarly represented. Each stage has an output, which is forwarded to the next stage thereof. Then, the next stage performs an evaluation task in response to the output of its previous stage and power clocks.

Figure 7:
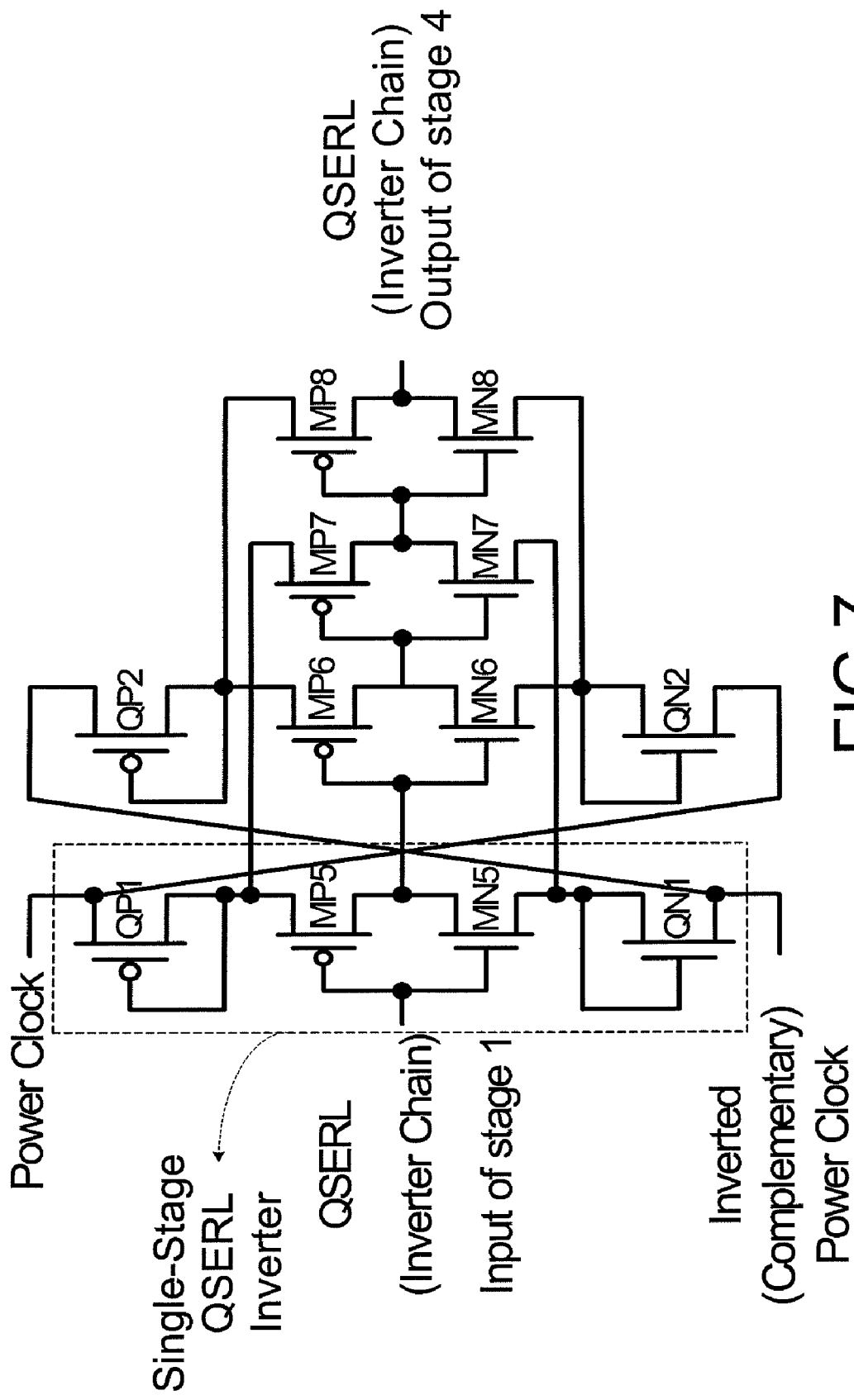
FIG. 7 is a schematic diagram of the four-stage inverter chain of QSERL with a power clock network in common.

As shown in FIG. 7, the QSERLs are used to form an inverter chain structure composed of four-stage inverters by using the MOS transistor QP1, QN1, QP2 and QN2 of the power clock network in common. In the inverter chain, the first inverter is composed of the MOS transistors MP5 and MN5, and the other inverters are also similarly represented. In this structure, the required number of the MOS transistors is no more than that of the QSERL. Assuming that the geometry ratios (W/L) of CP1, CP2, CN1, CN2, MP1, MP2, MP3, MP4, MN1, MN2, MN3, and MN4 are, respectively, the same as those of QP1, QP2, QN1, QN2, MP5, MP6, MP7, MP8, MN5, MN6, MN7, and MN8, W and L are the width and length of the MOS transistor, and the two cases have the same layout area.

In addition, the structure of the present invention has been demonstrated through the 0.18-μm CMOS technology of TSMC, Inc. In this demonstration, the adiabatic logic of the present invention and QSERL counterpart are used to implement a low-risk D-type flip flop respectively. The result is the D-type flip flop associated with the present invention has a reduction of power-delay (energy) product up to over 50% over the other case when a power clock having an operation frequency of 25 MHz and its inverted version thereof are inputted. This shows the adiabatic logic of the present invention can have a significant energy saving.

In addition, the D-type flip flop with the adiabatic logic of the present invention adiabatic logic used therein has been demonstrated that a throughput twice that of the D-type flip flop embedded with the QSERL can be achieved. It is to be noted that the present invention not only can be demonstrated through TSMC, Inc. and the 0.18-μm technology but can also be demonstrated and utilized by other manufacturing processes.

Aside from the good energy efficiency, the present invention also eliminates the disadvantages inhered from the prior art, such as output floating. In addition, the noise tolerance of the four-stage inverter chains formed with the adiabatic logic of the present invention and QSERL have been analyzed regarding their noise tolerance, respectively.

It can be seen the two cases each has an erroneous point of time through FIG. 5a. In FIG. 5a, the erroneous point occurs in the time period limited to the two dashed lines, respectively, i.e. the time period when the adiabatic charging and discharging paths are both turned off in the two cases. Within the time period, a pulse noise will make the output unpredictable in each of the two cases. This is because the noise will result in an output voltage moving around the Switching Point of logic level transition and, therefore, makes the output out of its correct logic state.

Figure 5B:
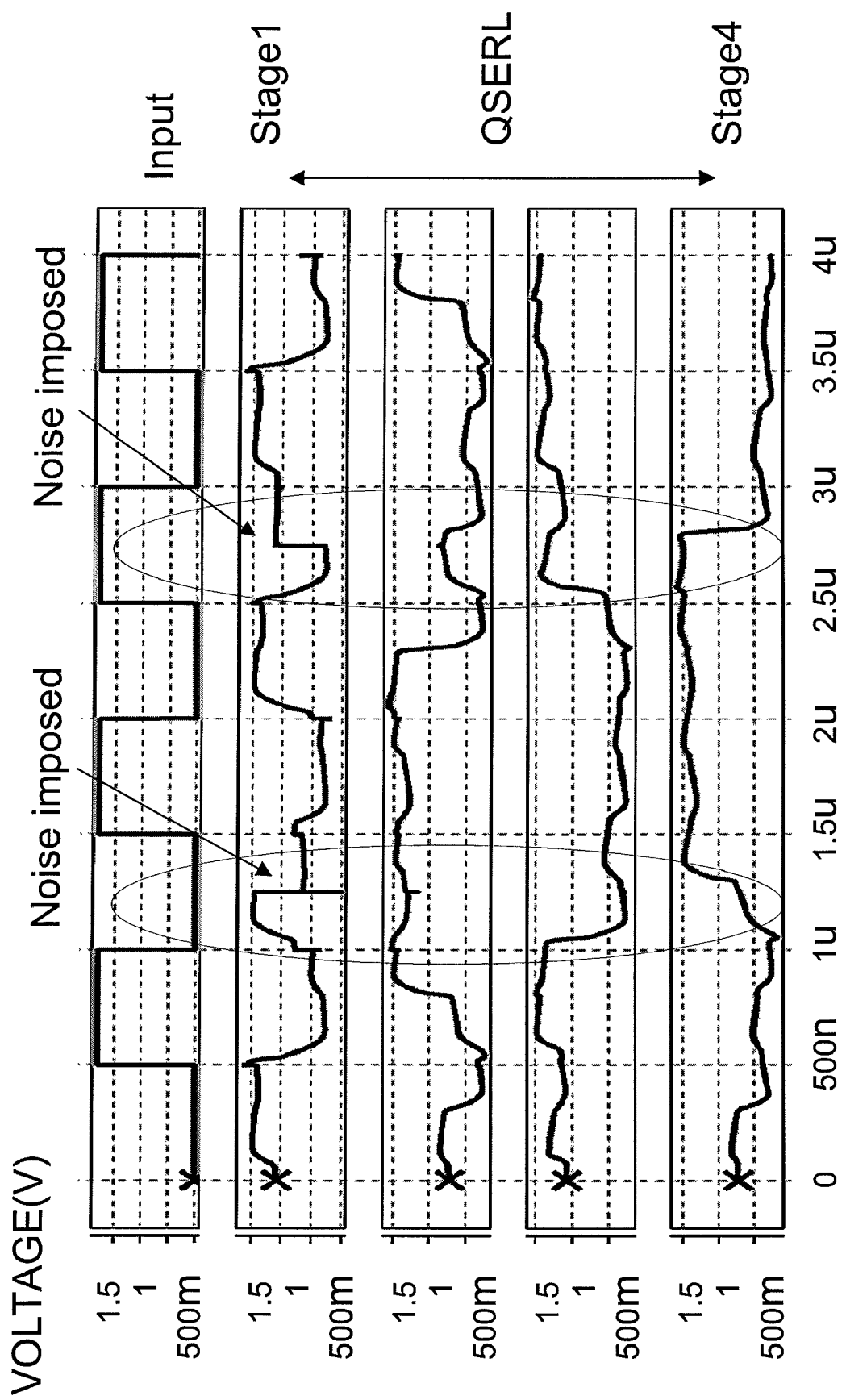
Figure 5C:
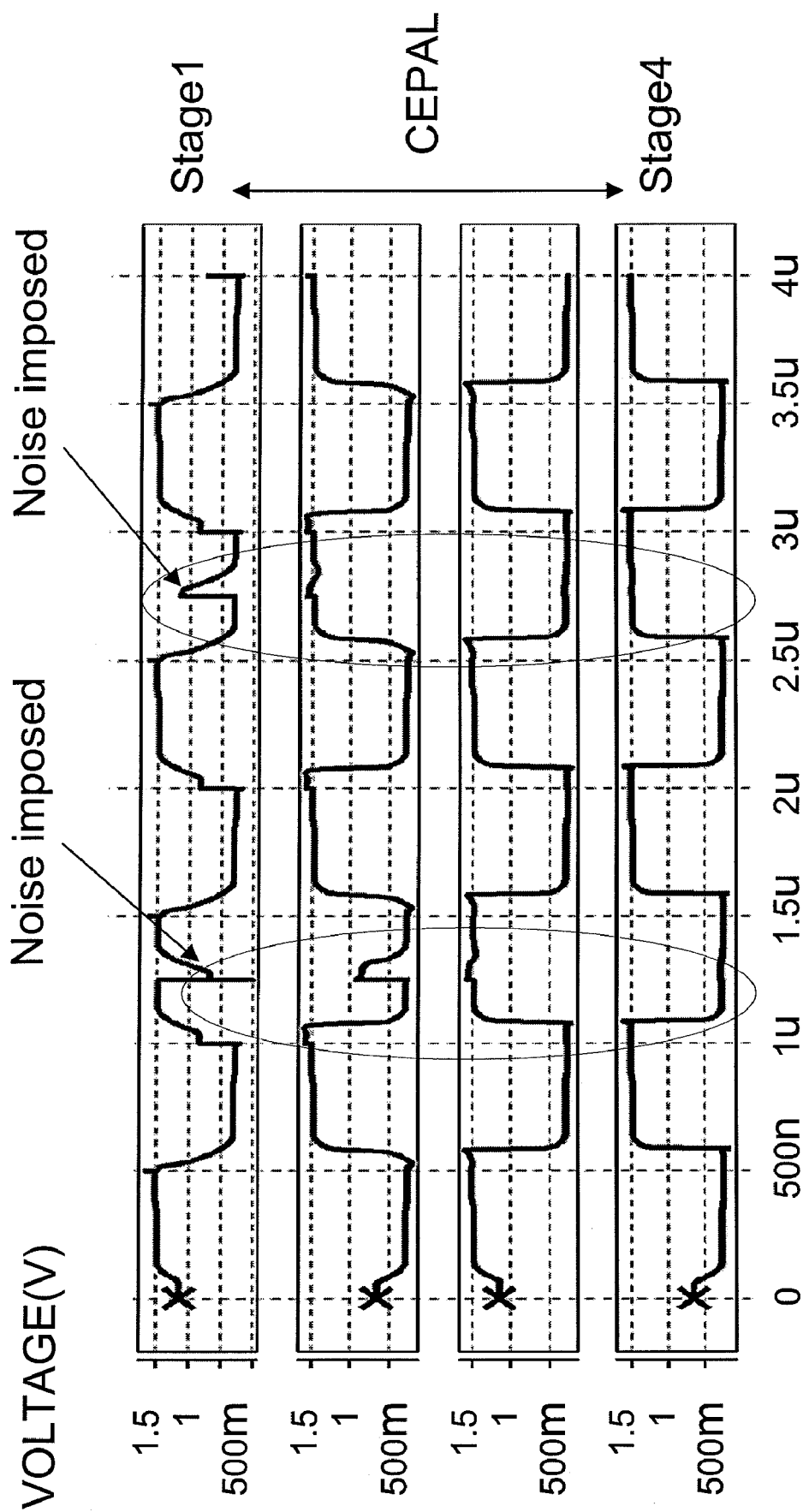
Figure 6:
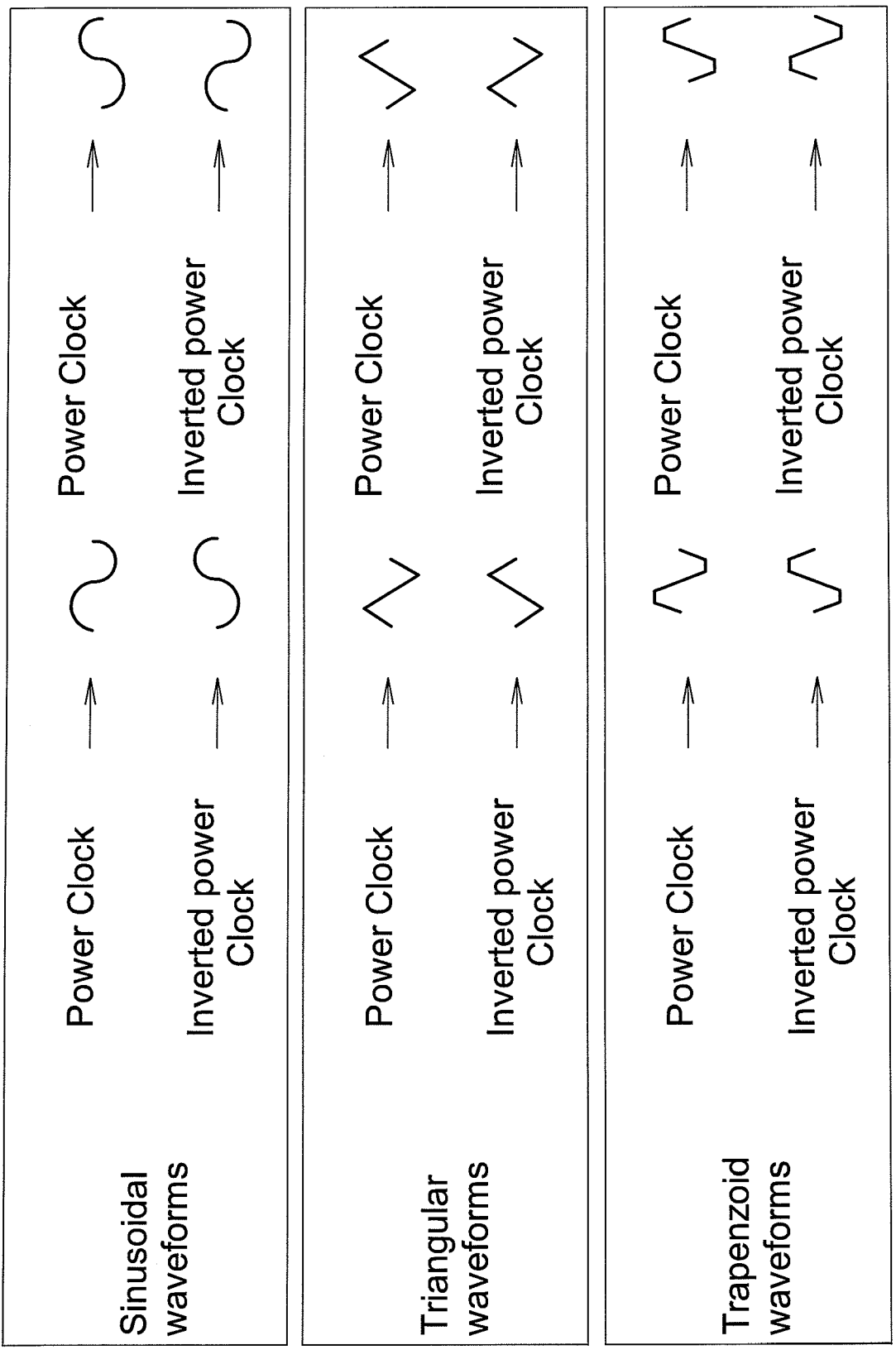
FIG. 6 is a schematic diagram of suitable types of a power clock and an inverted power clock.

Now refer to FIG. 5b. When two kinds of pulse noises are imposed on the outputs of the first stages of the four-stage inverter chains of the two cases mentioned above (as depicted in FIG. 5a), it can seen that both cases have erroneous outputs at their first stages. However, the adiabatic logic of the present invention can quickly force the output of the first stage to be exempted from the error and can get back to its normal state with the subsequently coming power clock (the subsequently coming power clock is complementary to the original power clock through which the first stage evaluates its output). Since the stage next to the first stage is free from effect on the output of the first stage, a normal operation can be achieved in the adiabatic logic of the present invention. By contrast, there exists a considerable latency in the consecutive stages of the four-stage inverter chains of QSERL, and, thus, the error occurring at the output of the first stage will be accumulated, making the four-stage inverter chain of QSERL totally fail.

Therefore, the adiabatic logic of the present invention is demonstrated to have good reliability and efficacy.

Reference

[1] V. De and J. D. Meindl, "Complementary adiabatic and fully adiabatic MOS logic families for gigascale integration," Proc. ISSCC Dig. Tech. Papers, pp. 298-299, 1996.

[2] M.-E. Hwang, A. Raychowdhury, K. Roy, "Energy-Recovery Techniques to Reduce On-Chip Power Density in Molecular Nanotechnologies," IEEE Trans. Circuits Syst. I, vol. 52, pp. 1580-1589, August 2005.

What is claimed is:

1. A complementary energy path adiabatic logic, comprising:

a power clock network comprising at least one stage including a P-type MOS transistor member, an N-type MOS transistor member, a first P-type MOS transistor, a first N-type MOS transistor, a second N-type MOS transistor, and a second P-type MOS transistor;

an evaluation network comprising at least one stage including a P-type MOS transistor element and an N-type MOS transistor element, with the evaluation network being connected to an output of the at least one stage of the power clock network;

a power clock connected to inputs of the first P-type MOS transistor and the second N-type MOS transistor; and an inverted complementary power clock connected to inputs of the second P-type MOS transistor and the first N-type MOS transistor, wherein an output of the first P-type MOS transistor is connected to an output of the second P-type MOS transistor, an output of the first N-type MOS transistor is connected to an output of the second N-type MOS transistor, the output of the first P-type MOS transistor is connected to a last stage of the at least one stage of the power clock network, and the output of the first N-type MOS transistor is connected to the last stage of the at least one stage of the power clock network; and wherein the evaluation network evaluates the output of the at least one stage of the power clock network as the power clock and the inverted complimentary power clock operate.

2. The complementary energy path adiabatic logic circuit as claimed in claim 1, wherein each of the at least one stage of the evaluation network is an inverter logic circuit.

3. The complementary energy path adiabatic logic circuit as claimed in claim 2, wherein the inverter logic circuit is a four-stage inverter logic circuit.

4. The complementary energy path adiabatic logic circuit as claimed in claim 1, wherein each of the at least one stage of the evaluation network is an NOR logic circuit.

5. The complementary energy path adiabatic logic circuit as claimed in claim 1, wherein each of the at least one stage of the evaluation network is an NAND logic circuit.

6. The complementary energy path adiabatic logic circuit as claimed in claim 1, wherein each of the at least one stage of the evaluation network is a flip-flop logic circuit.

7. The complementary energy path adiabatic logic circuit as claimed in claim 6, wherein the flip-flop logic circuit is a D-type flip-flop circuit.

8. The complementary energy path adiabatic logic circuit as claimed in claim 1, wherein each of the at least one stage of the evaluation network is an adder logic circuit.

* * * * *

UNITED STATES PATENT AND TRADEMARK OFFICE
CERTIFICATE OF CORRECTION

PATENT NO. : 7,746,117 B2
APPLICATION NO. : 12/236571
DATED : June 29, 2010
INVENTOR(S) : Cihun-Siyong Gong, et al.

It is certified that error appears in the above-identified patent and that said Letters Patent is hereby corrected as shown below:

Title Page, under Item (12) delete "Hong" and insert -- Gong --.

Title Page, Item (75) Inventors should read
-- Inventors: Cihun-Siyong Gong, Kaohsiung (TW);
　　　　　　Ci-Tong Hong, Xinzhuang (TW);
　　　　　　Muh-Tian Shiue, Hsin-chu (TW);
　　　　　　Kai-Wen Yao, Hengchun Township, Pingtung County (TW);
　　　　　　Chun-Hsien Su, Kaohsiung (TW); --.

Title Page, Item (73) Assignee should read
-- (73) Assignee: National Central University, Jhongli City (TW) --.

Signed and Sealed this

Twenty-third Day of November, 2010

David J. Kappos
*Director of the United States Patent and Trademark Office*